(12) United States Patent
Iura

(10) Patent No.: US 12,074,046 B2
(45) Date of Patent: Aug. 27, 2024

(54) ALIGNER

(71) Applicant: DAIHEN Corporation, Osaka (JP)

(72) Inventor: Jun Iura, Osaka (JP)

(73) Assignee: ROHM CO., LTD., Kyoto (JP)

(*) Notice: Subject to any disclaimer, the term of this patent is extended or adjusted under 35 U.S.C. 154(b) by 454 days.

(21) Appl. No.: 17/472,312

(22) Filed: Sep. 10, 2021

(65) Prior Publication Data

US 2022/0084863 A1    Mar. 17, 2022

(30) Foreign Application Priority Data

Sep. 15, 2020 (JP) .................. 2020-154361

(51) Int. Cl.
*H01L 21/68* (2006.01)
*H01L 21/687* (2006.01)
(52) U.S. Cl.
CPC ........ *H01L 21/68* (2013.01); *H01L 21/68742* (2013.01); *H01L 21/68764* (2013.01)
(58) Field of Classification Search
CPC ............... H01L 21/68; H01L 21/68742; H01L 21/68764; H01L 21/6875
USPC ...................................... 318/3, 34
See application file for complete search history.

(56) References Cited

U.S. PATENT DOCUMENTS

| | | | |
|---|---|---|---|
| 6,300,584 B1* | 10/2001 | Song | H01L 21/67271 209/552 |
| 6,857,838 B2* | 2/2005 | Kuroda | H01L 21/681 414/935 |
| 9,008,817 B2* | 4/2015 | Amano | H01L 21/68 414/226.04 |
| 2015/0153729 A1 | 6/2015 | Kurahashi et al. | |
| 2018/0101165 A1 | 4/2018 | Kurahashi et al. | |

FOREIGN PATENT DOCUMENTS

JP    2015-195328 A    11/2015

* cited by examiner

*Primary Examiner* — David Luo
(74) *Attorney, Agent, or Firm* — HSML P.C.

(57) ABSTRACT

An aligner includes a first rotation drive mechanism, a second rotation drive mechanism and an elevation mechanism. The first rotation drive mechanism includes a first support portion that supports a workpiece, and a first drive source for rotatively driving the first support portion about a first vertical axis. The second rotation drive mechanism includes a second support portion that supports the workpiece, and a second drive source for rotatively driving the second support portion about a second vertical axis. The elevation mechanism is configured to move the workpiece supported by the second support portion up and down.

6 Claims, 12 Drawing Sheets

ALIGNER

FIELD

The present invention relates to an aligner. Specifically, the present invention relates to a technique for correcting the displacement of a workpiece (semiconductor wafer or the like) based on displacement amount information indicating displacement amounts of the workpiece from a reference position.

BACKGROUND

An example of a conventional semiconductor process will be described. A wafer (workpiece) is transferred to a load-lock chamber, and is then transferred to a processing chamber by a transfer robot. When processing of certain types is to be performed in the processing chamber, the wafer needs to be transferred accurately to a reference position in the processing chamber. To make this possible, an aligner is conventionally used, as disclosed in JP-A-2015-195328 for example. The aligner is used prior to the transfer of the workpiece to the processing chamber. Specifically, the aligner is configured so as to be capable of detecting, for a single wafer placed on a mounting table, a displacement amount of the wafer in a planar direction (X-Y direction) and a displacement amount of the wafer in a rotation direction (θ direction). Furthermore, the above-described aligner is provided with a moving unit for moving the wafer in the planar direction (X-Y direction) and the rotation direction (θ direction) using such pieces of displacement amount information. For example, the moving unit includes an x-axis direction moving mechanism and a y-axis direction moving mechanism for moving the wafer placed on the mounting table linearly along two orthogonal axes that are parallel with a horizontal plane, and a rotation mechanism for rotating the wafer about a vertical axis. According to such an aligner, the displacement of a wafer can be corrected by moving the wafer to predetermined positions (horizontal-direction and rotation-direction positions) based on the above-described displacement amount information.

In the above-described aligner disclosed in JP-A-2015-195328, in order to correct wafer displacement, two translation shafts are used for the movement in the X direction and Y direction, and one rotation shaft is used for the movement in the rotation direction. That is, three drive shafts are necessary to correct the displacement of a single wafer. Furthermore, for each translation shaft, a ball screw and a guide member are necessary, and many parts are thus required. Thus, many parts are included in the above-described aligner, leading to an increase in the size and the complexity in structure of the entire device.

SUMMARY

The present invention has been contrived under such circumstances. Thus, one problem addressed by the present invention is to provide an aligner with which the displacement in a planar direction (X-Y direction) and a rotation direction (θ direction) about a vertical axis can be corrected using a small number of drive shafts.

In order to solve the above-described problem, the following technical means are adopted in the present invention.

An aligner provided by the present invention includes: a first rotation drive mechanism that includes a first support portion that supports a workpiece, and a first drive source for rotatively driving the first support portion about a first vertical axis; a second rotation drive mechanism that includes a second support portion that supports the workpiece, and a second drive source for rotatively driving the second support portion about a second vertical axis; and an elevation mechanism that moves the workpiece supported by the second support portion up and down.

Preferably, the first support portion includes a first mounting surface on which the workpiece is placed, and the elevation mechanism includes a second mounting surface on which the workpiece is placed, and moves the second mounting surface up and down between a first position that is lower than the first mounting surface and a second position that is higher than the first mounting surface.

Preferably, the first support portion of the first rotation drive mechanism is provided with a suction portion for sucking the workpiece.

Preferably, the elevation mechanism includes a plurality of elevation cylinders that are arranged so as to be separated from one another in the horizontal direction, and the elevation cylinders each have the second mounting surface on the upper end portion thereof.

Preferably, the first rotation drive mechanism further includes: a first arm that is connected to the first drive source and that extends in parallel with a horizontal plane; a first driving pulley that is rotatively driven by the first drive source; a first driven pulley that is supported by the first arm so as to be rotatable about the first vertical axis; and a first belt that is wrapped around the first driving pulley and the first driven pulley, the first support portion is arranged higher than the first driven pulley and is connected to the first driven pulley, the second rotation drive mechanism further includes: a second arm that is connected to the second drive source and that extends in parallel with a horizontal plane; a second driving pulley that is rotatively driven by the second drive source; a second driven pulley that is supported by the second arm so as to be rotatable about the second vertical axis; and a second belt that is wrapped around the second driving pulley and the second driven pulley, the second support portion includes a workpiece-supporting arm that extends in parallel with a horizontal plane, and the plurality of elevation cylinders are supported by the workpiece-supporting arm so as to be separated from one another.

Preferably, the first drive source is arranged on one side in a first direction that is parallel with a horizontal plane from the first driven pulley, the second driven pulley and the second drive source are arranged on the other side in the first direction from the first driven pulley, the elevation mechanism is formed from a pair of the elevation cylinders, and the pair of elevation cylinders are arranged on opposite sides of the first vertical axis from one another. More preferably, the pair of elevation cylinders are arranged so as to be separated from one another in a second direction that is parallel with a horizontal plane and that is perpendicular to the first direction.

Preferably, a plurality of first rotation drive mechanisms, a plurality of second rotation drive mechanisms, and a plurality of elevation mechanisms are provided, the first driven pulleys in the plurality of first rotation drive mechanisms are arranged across a gap from one another in the top-bottom direction and are arranged so as to overlap in a plan view, the first drive source and the first driving pulley in each of the plurality of first rotation drive mechanisms are arranged across a gap from the first drive source and the first driving pulley in other ones of the plurality of first rotation drive mechanisms in the circumferential direction of the first vertical axis in a plan view, the second driven pulleys in the plurality of second rotation drive mechanisms are arranged across a gap from one another in the top-bottom direction and are arranged so as to overlap in a plan view, and the second drive source and the second driving pulley in each of the plurality of second rotation drive mechanisms are arranged across a gap from the second drive source and the second driving pulley in other ones of the plurality of second rotation drive mechanisms in the circumferential direction of the second vertical axis in a plan view.

According to the aligner according to the present invention, the displacement of a workpiece in both a planar direction (X-Y direction) and a rotation direction (θ direction) can be corrected through cooperation between a first rotation drive mechanism rotatively driving a first support portion about a first vertical axis and a second rotation drive mechanism rotatively driving a second support portion about a second vertical axis. That is, according to the aligner according to the present invention, the displacement of a workpiece in the planar direction (X-Y direction) and the rotation direction (θ direction) can be corrected in an appropriate manner using two drive shafts, which is less than the conventional number of drive shafts.

Furthermore, in the aligner according to the present invention, a rotation shaft is used for the correction of displacement in both the first rotation drive mechanism and the second rotation drive mechanism. As mentioned above, in a case in which translation shafts are used, the number of parts increases and the installation space also increases compared to a case in which rotation shafts are used. In contrast, according to the aligner according to the present invention, in which translation shafts are not used, the first and second rotation drive mechanisms are formed from a small number of parts, and thus cost can be reduced and the structure of the entire device can be simplified while reducing the size of the entire device.

Other features and advantages of the present invention shall become apparent from the detailed description provided in the following with reference to the attached drawings.

EMBODIMENTS

In the following, preferred embodiments of the present invention will be described with reference to the drawings.

FIGS. 1-4 illustrate an aligner pertaining to a first embodiment of the present invention. An aligner A1 according to the present embodiment includes a first rotation drive mechanism 1, a second rotation drive mechanism 2, and an elevation mechanism 3, and is used to correct the displacement of a semiconductor wafer that is a workpiece W having the shape of a thin plate, for example. The workpiece W is transferred to a processing chamber by a transfer robot, for example, and the aligner A1 is configured to correct the displacement of the workpiece W from a predetermined reference position before the workpiece W is transferred to the processing chamber.

Figure 1:
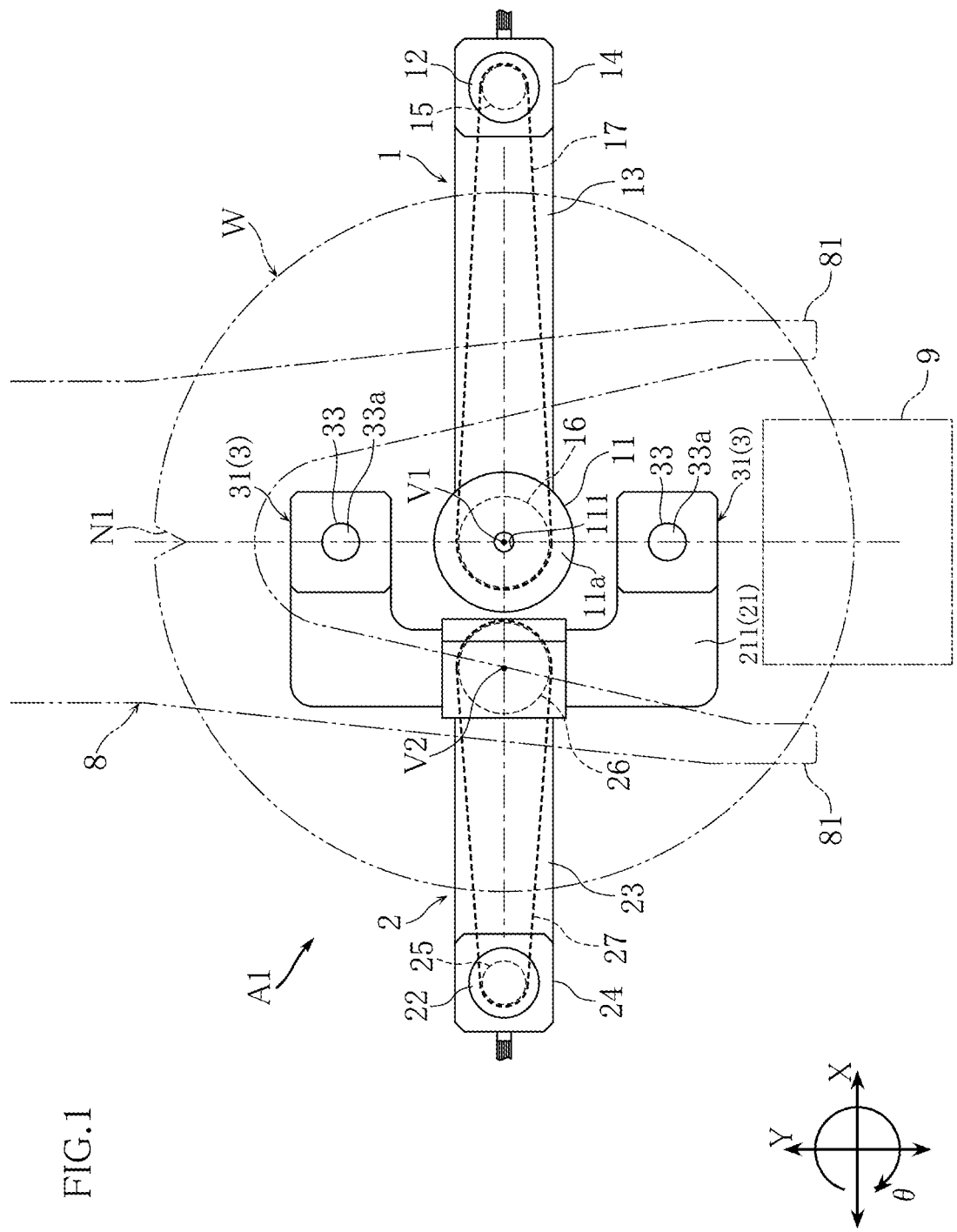
FIG. 1 is a plan view illustrating an aligner according to a first embodiment.
Figure 2:
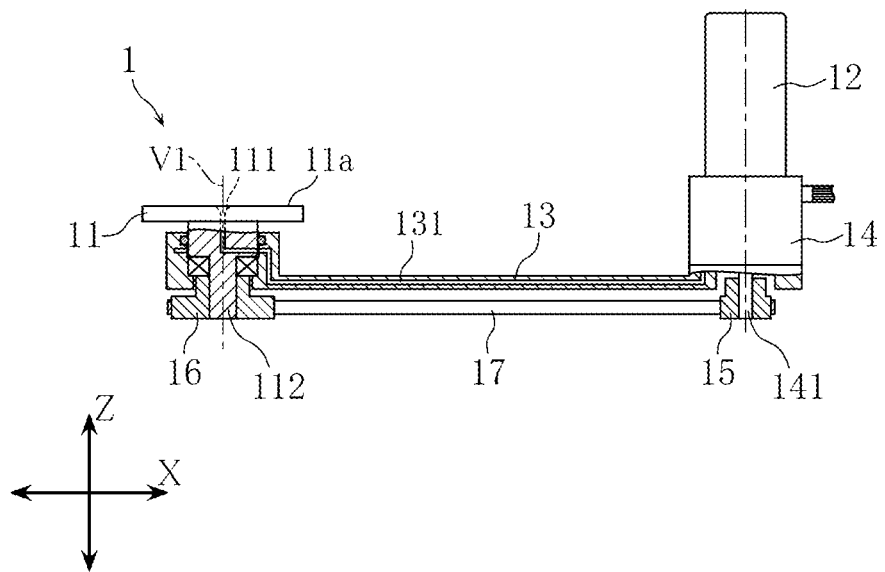
FIG. 2 is a front view of a first rotation drive mechanism, and a part of the first rotation drive mechanism is illustrated in a longitudinal section view.

As illustrated in FIGS. 1 and 2, the first rotation drive mechanism 1 includes a first support portion 11, a first drive source 12, a first arm 13, a first driving pulley 15, a first driven pulley 16, and a first belt 17. The first support portion 11 is a portion that supports the workpiece W, and is formed as a disk-shaped mounting table in the present embodiment. The upper end surface of the first support portion 11 is configured as a first mounting surface 11a for placing the workpiece W thereon. The first support portion 11 has a shaft portion 112 that extends downward.

The first drive source 12 is a drive source for rotatively driving the first support portion 11, and includes a motor, for example. The first drive source 12 and the first support portion 11 are arranged so as to be separated from one another in the horizontal direction. The first arm 13 extends in parallel with a horizontal plane, and one end portion thereof is connected to the first drive source 12 via a decelerator 14. The decelerator 14 decelerates the rotation speed of an output shaft of the first drive source 12, and is a gear decelerator, for example. The first driving pulley 15 is attached to a rotary shaft 141 of the decelerator 14, and is rotatively driven by the first drive source 12.

The first driven pulley 16 is attached to the shaft portion 112 of the first support portion 11. The first support portion 11 and the first driven pulley 16 are supported by the other end portion of the first arm 13. Specifically, the first support portion 11 and the first driven pulley 16 are supported by the first arm 13 via a bearing, etc., and can rotate about a first vertical axis V1. The first belt 17 is an endless belt, and is wrapped around the first driving pulley 15 and the first driven pulley 16 described above.

According to the above-described configuration, when the first drive source 12 is driven, the first driving pulley 15 is rotatively driven and this rotational driving force is transmitted to the first support portion 11 via the first belt 17 and the first driven pulley 16. The first support portion 11 is rotatively driven about the first vertical axis V1 in such a manner.

In the present embodiment, the first support portion 11 is provided with a suction portion 111. The suction portion 111 is formed from a suction pad or the like that has an opening in the upper surface (first mounting surface 11a) of the first support portion 11, and is in communication with a ventilation passage 131 formed in the first arm 13. The workpiece W placed on the first mounting surface 11a of the first support portion 11 is sucked by the suction portion 111 due to the vacuum pressure generated by an unillustrated vacuum pump. The suction effect of the suction portion 111 can be switched on and off, as appropriate.

Figure 3:
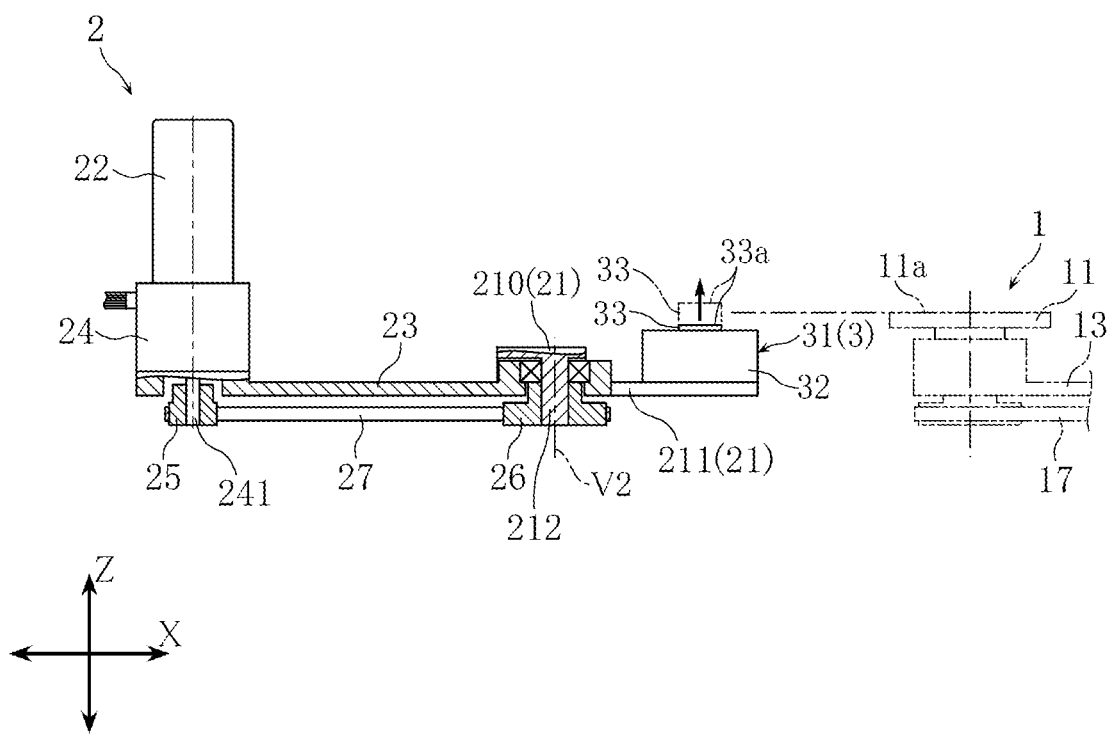
FIG. 3 is a front view of a second rotation drive mechanism, and a part of the second rotation drive mechanism is illustrated in a longitudinal section view.

As illustrated in FIGS. 1 and 3, the second rotation drive mechanism 2 includes a second support portion 21, a second drive source 22, a second arm 23, a second driving pulley 25, a second driven pulley 26, and a second belt 27. The second support portion 21 is a portion that supports the workpiece W, and includes a base portion 210, a workpiece-supporting arm 211, and a shaft portion 212 in the present embodiment. The workpiece-supporting arm 211 is connected to the base portion 210, and extends in parallel with a horizontal plane. The shaft portion 212 extends downward of the base portion 210. Specifically, the workpiece-supporting arm 211 is formed in a C shape in a plan view, and is connected to the base portion 210 at the center thereof.

The second drive source 22 is a drive source for rotatively driving the second support portion 21, and includes a motor, for example. The second drive source 22 and the second support portion 21 are arranged so as to be separated from one another in the horizontal direction. The second arm 23 extends in parallel with a horizontal plane, and one end portion thereof is connected to the second drive source 22 via a decelerator 24. The decelerator 24 decelerates the rotation speed of an output shaft of the second drive source 22, and is a gear decelerator, for example. The second driving pulley 25 is attached to a rotary shaft 241 of the decelerator 24, and is rotatively driven by the second drive source 22.

The second driven pulley 26 is attached to the shaft portion 212 of the second support portion 21. The second support portion 21 and the second driven pulley 26 are supported by the other end portion of the second arm 23. Specifically, the second support portion 21 and the second driven pulley 26 are supported by the second arm 23 via a bearing, etc., and can rotate about a second vertical axis V2. The second belt 27 is an endless belt, and is wrapped around the second driving pulley 25 and the second driven pulley 26 described above.

According to the above-described configuration, when the second drive source 22 is driven, the second driving pulley 25 is rotatively driven and this rotational driving force is transmitted to the second support portion 21 via the second belt 27 and the second driven pulley 26. The second support portion 21 is rotatively driven about the second vertical axis V2 in such a manner.

The elevation mechanism 3 is a mechanism for moving the workpiece W supported by the second support portion 21 up and down. As illustrated in FIG. 1, the elevation mechanism 3 includes a plurality of elevation cylinders 31. In the present embodiment, the elevation mechanism 3 is formed from a pair of elevation cylinders 31. The pair of elevation cylinders 31 are provided on the two end portions of the workpiece-supporting arm 211, and are arranged so as to be separated from one another in the horizontal direction. In the present embodiment, the pair of elevation cylinders 31 are arranged at opposite sides of the first vertical axis V1 from one another.

For example, each elevation cylinder 31 is formed from an air cylinder, and includes a cylinder portion 32 and a rod portion 33, as illustrated in FIG. 3. The rod portion 33 can reciprocate along the Z direction (top-bottom direction), and the end surface of the upper end portion of the rod portion 33 is configured as a second mounting surface 33a for placing the workpiece W thereon. The second mounting surface 33a is moved up and down between a first position (illustrated using a solid line in FIG. 3) that is lower than the first mounting surface 11a of the first support portion 11, and a second position (illustrated using an imaginary line in FIG. 3) that is higher than the first mounting surface 11a.

Figure 4:
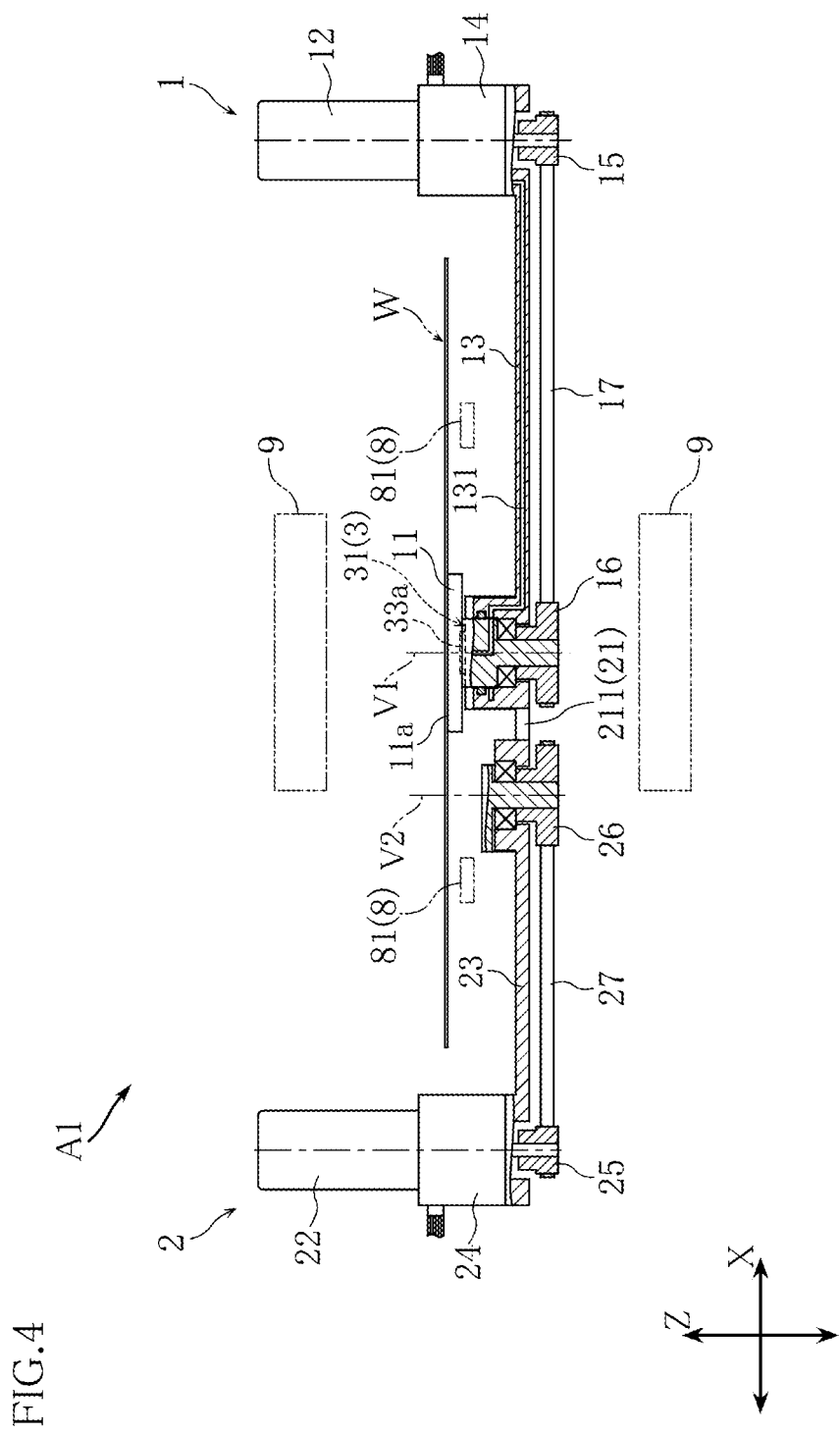
FIG. 4 is a front view of the aligner illustrated in FIG. 1, and a part of the aligner is illustrated in a longitudinal section view.

As illustrated in FIGS. 1 and 4, the first rotation drive mechanism 1 is arranged so as to extend in the X direction (first direction), which is parallel with a horizontal plane. Specifically, the first drive source 12 of the first rotation drive mechanism 1 is arranged on one side (the right side in FIGS. 1 and 4) in the X direction from the first driven pulley 16. The second driven pulley 26 and the second drive source 22 of the second rotation drive mechanism 2 are arranged on the other side (the left side in FIGS. 1 and 4) in the X direction from the second driven pulley 26 of the first rotation drive mechanism 1. Furthermore, the second drive source 22 is arranged on the other side in the X direction from the second driven pulley 26. Thus, the first arm 13 of the first rotation drive mechanism 1 and the second arm 23 of the second rotation drive mechanism 2 are arranged so as to extend in the X direction as a whole.

As could be understood from FIGS. 1 and 4, the pair of elevation cylinders 31 are arranged so as to be separated from one another in the Y direction (second direction). The Y direction is parallel with a horizontal plane and is perpendicular to the X direction.

For example, the aligner A1 according to the present embodiment is arranged in a transfer area that is adjacent to a processing chamber. In the transfer area, the workpiece W is transferred by a transfer robot (illustration omitted) and set to the aligner A1. The transfer robot includes a hand 8 (illustrated using an imaginary line in FIGS. 1 and 4) for supporting the workpiece W. The hand 8 includes a bifurcated fork 81, for example, and the workpiece W is placed on the fork 81. The hand 8 illustrated in FIG. 1 moves from the upper side of the drawing to the lower side of the drawing along the Y direction, and is moved into the space above the aligner A1. When the hand 8 is lowered from this state, the workpiece W is placed on the first mounting surface 11a of the first support portion 11 (first rotation drive mechanism 1) and transferred to the aligner A1, as illustrated in FIG. 4. The workpiece W (semiconductor wafer) typically has the shape of a circular plate, and a cutaway portion (not illustrated) called an orientation flat or a notch N1 for detecting the rotational orientation of the workpiece W is formed in the outer circumference of the workpiece W.

The aligner A1 corrects the position of the workpiece W based on displacement amount information indicating displacement amounts of the workpiece W from the reference position. For example, displacement amounts of the workpiece W are acquired by a displacement amount detecting means 9 that is arranged near the aligner A1. The displacement amount detecting means 9 may have any configuration as long as displacement amounts of the workpiece W in a planar direction (X-Y direction) and a rotation direction (θ direction) can be detected. For example, the displacement amount detecting means 9 may be configured to include a light-emitting unit and a light-receiving sensor (area sensor). In this case, changes in light reception amount that are in accordance with the outline shape of the workpiece W are detected using the light-receiving sensor while rotating the workpiece W once about the first vertical axis V1 using the first rotation drive mechanism 1, and the detection result is digitized. Then, by performing predetermined computation processing based on the data of the outline shape of the entire outer circumference of the workpiece W, displacement amounts of the workpiece W in the planar direction (X-Y direction) and the rotation direction (θ direction) are calculated.

An example of the operation of the aligner A1 having the above-described configuration will be described below with reference to FIGS. 5-9.

Figure 5:
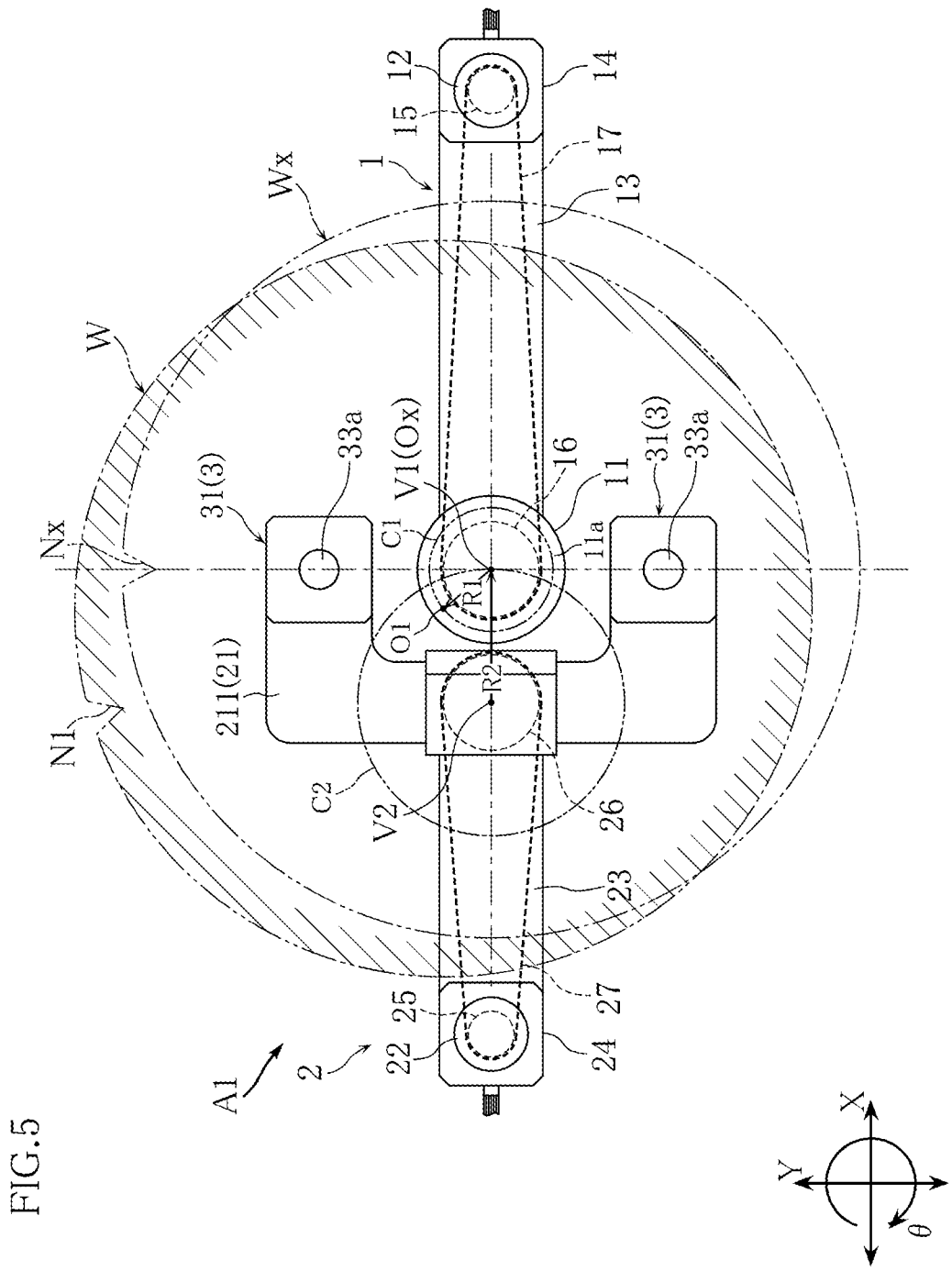
FIG. 5 is a plan view for describing an operating state of the aligner illustrated in FIG. 1.

In FIG. 5, a workpiece W having been transferred from the hand 8 to the aligner A1 is illustrated using an imaginary line, and hatching is provided near the outline of the workpiece W. Furthermore, the center position of the workpiece W is illustrated as a workpiece center O1.

In FIG. 5, the position that the workpiece W should arrive at after the correction of position is defined as a "reference workpiece position Wx" and is illustrated using an imaginary line. Furthermore, the center position in the reference workpiece position Wx is illustrated as a reference center Ox, and the position of the notch in the reference workpiece position Wx is illustrated as a reference notch position Nx. In a plan view, the reference center Ox overlaps with the first vertical axis V1, which is the rotation center of the first support portion 11 of the first rotation drive mechanism 1.

As illustrated in FIG. 5, a circle that has a radius (hereinafter "first radius R1") corresponding to the distance from the first vertical axis V1 to the workpiece center O1 and that is centered around the first vertical axis V1 in a plan view is set as a first orbit circle C1. Furthermore, a circle that has a radius (hereinafter "second radius R2") corresponding to the distance from the second vertical axis V2 to the first vertical axis V1 and that is centered around the second vertical axis V2 in a plan view is set as a second orbit circle C2. Here, the position of the workpiece center O1 may differ for each workpiece W placed on the aligner A1. Accordingly, the first radius R1 and the first orbit circle C1 may change. On the other hand, the second radius R2 is determined by the layout of the first rotation drive mechanism 1 and the second rotation drive mechanism 2. Accordingly, even if a different workpiece W is placed on the aligner A1, the second radius R2 and the second orbit circle C2 each remain the same.

Figure 6:
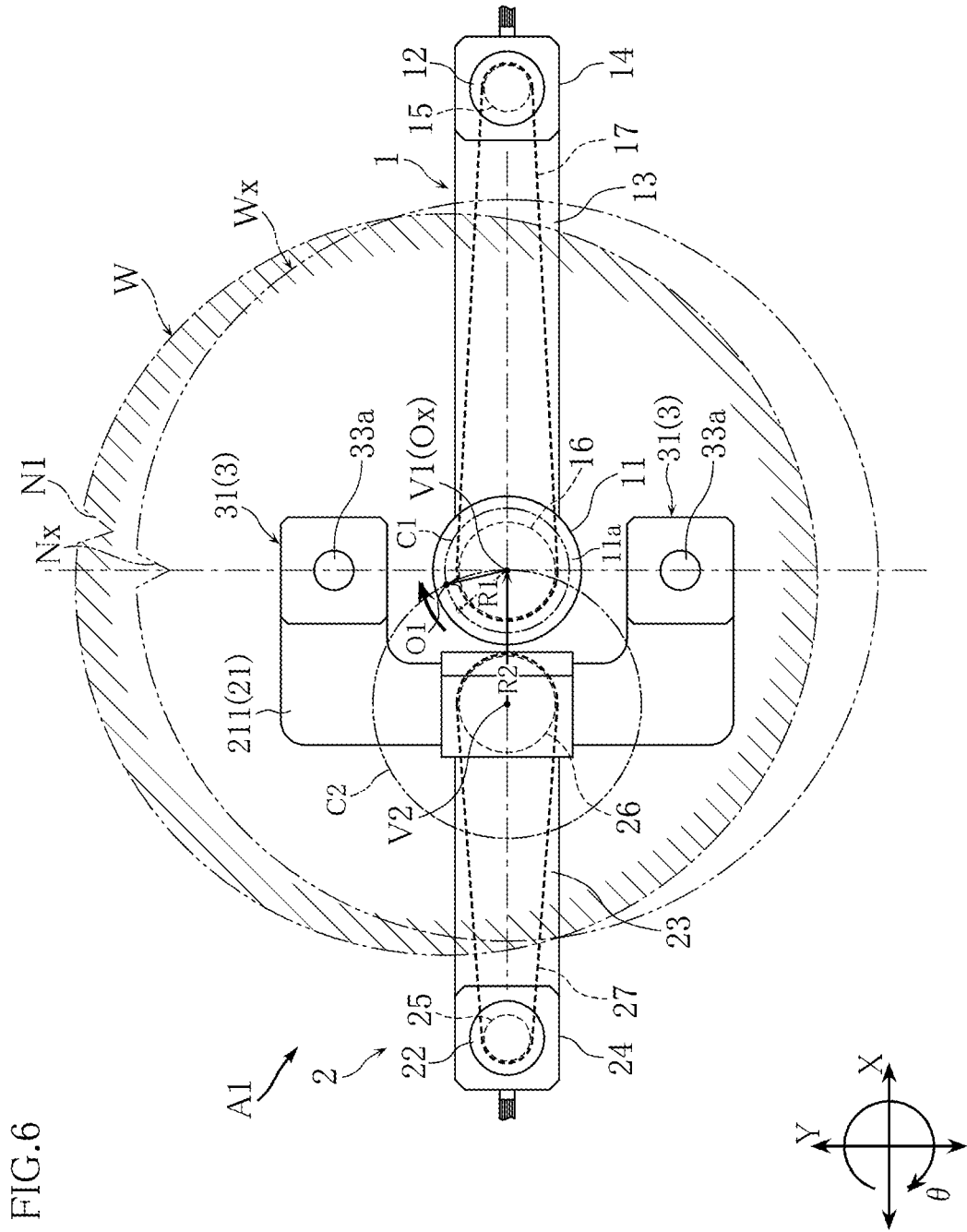
FIG. 6 is a plan view for describing the operating state of the aligner illustrated in FIG. 1.

Then, as illustrated in FIG. 6, the first rotation drive mechanism 1 is driven and the first support portion 11 is rotated in the clockwise direction as indicated by the bold arrow. Here, the workpiece W placed on the first mounting surface 11a of the first support portion 11 rotates about the first vertical axis V1 while being sucked and held by the suction portion 111. When the workpiece W rotates in such a manner, the workpiece center O1 moves along the first orbit circle C1 and arrives at the position of a point where the first orbit circle C1 and the second orbit circle C2 intersect. The suction by the suction portion 111 is switched off after the workpiece center O1 has moved to the above-described point of intersection.

Figure 7:
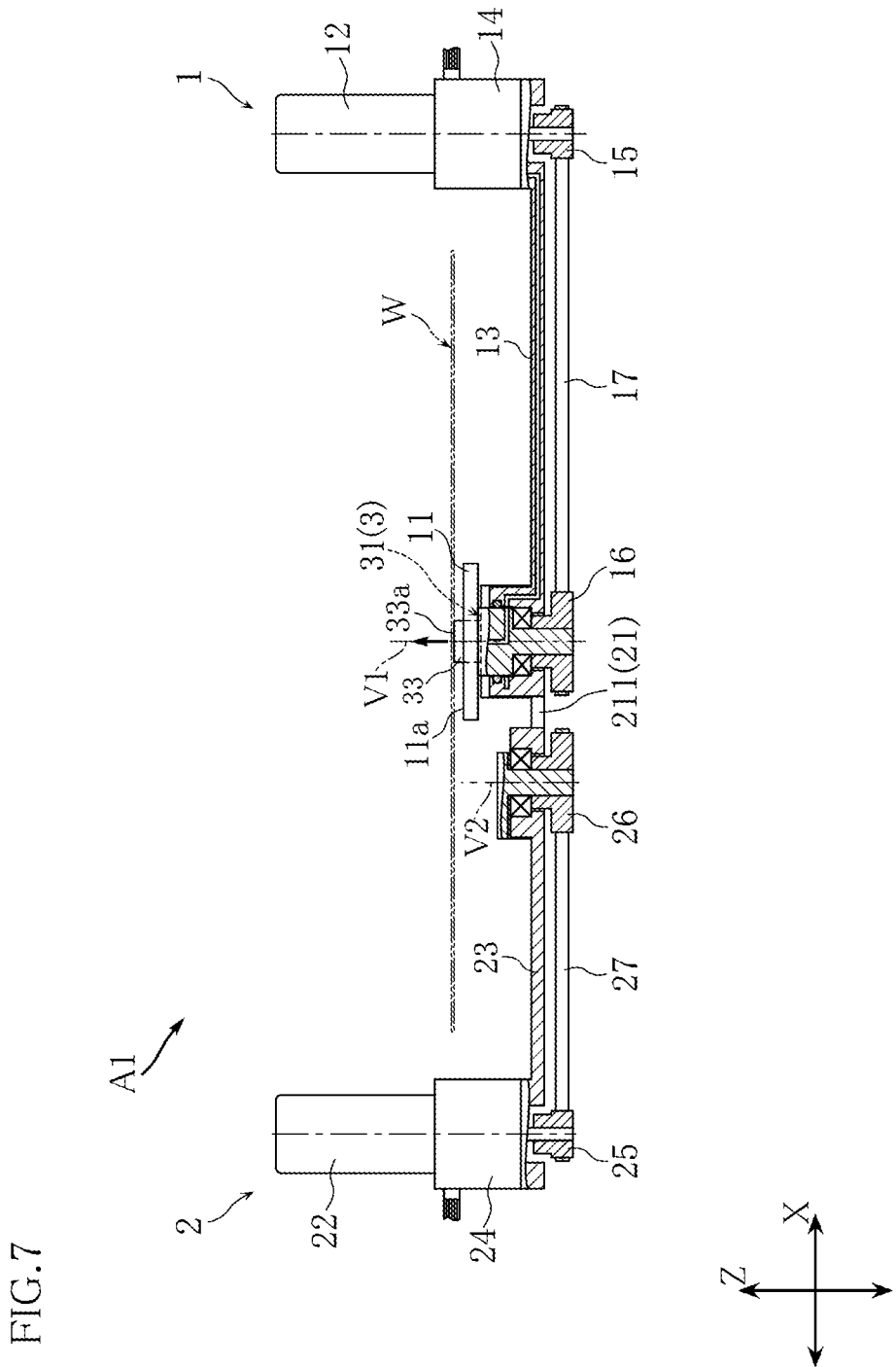
FIG. 7 is a front view for describing the operating state of the aligner illustrated in FIG. 1, and a part of the aligner is illustrated in a longitudinal section view.

Next, the rod portions 33 of the pair of elevation cylinders 31 are raised, as illustrated in FIG. 7. Here, the second mounting surfaces 33a of the elevation cylinders 31 move up from the first position lower than the first mounting surface 11a of the first support portion 11 to the second position higher than the first mounting surface 11a. Thus, the workpiece W is lifted up by the pair of elevation cylinders 31 and is placed on the second mounting surfaces 33a. In this state, the workpiece W is supported by the second support portion 21 via the pair of elevation cylinders 31 (elevation mechanism 3).

Figure 8:
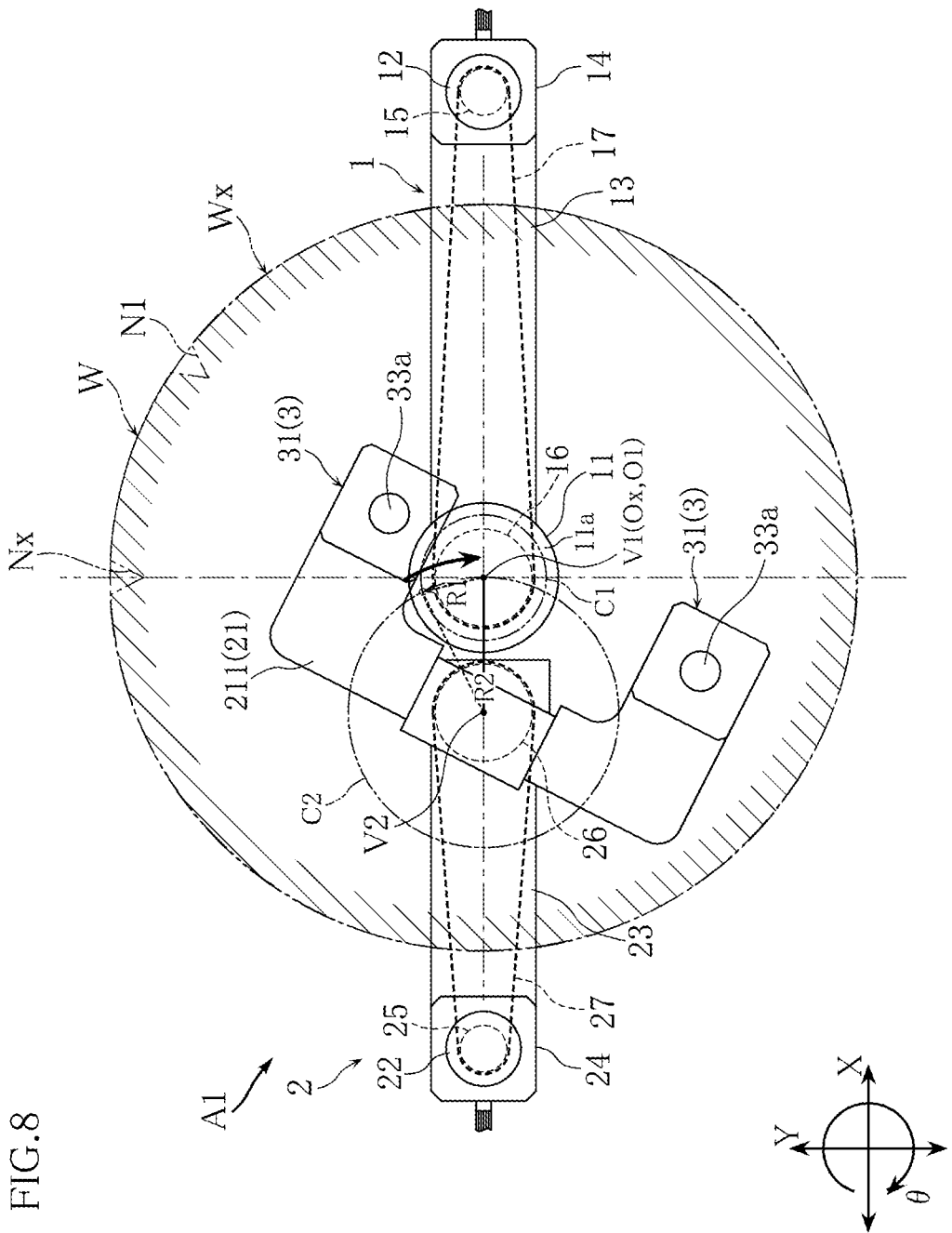
FIG. 8 is a plan view for describing the operating state of the aligner illustrated in FIG. 1.

Next, as illustrated in FIG. 8, the second rotation drive mechanism 2 is driven and the second support portion 21 is rotated in the clockwise direction in the drawing as indicated by the bold arrow. When the second support portion 21 is rotated in such a manner, the pair of elevation cylinders 31 provided on the workpiece-supporting arm 211 of the second support portion 21 rotate about the second vertical axis V2. Furthermore, the workpiece W placed on the second mounting surfaces 33a of the pair of elevation cylinders 31 also rotates about the second vertical axis V2. When the workpiece W rotates in such a manner, the workpiece center O1 moves along the second orbit circle C2 and arrives at a position (reference center Ox) where the workpiece center O1 overlaps with the first vertical axis V1. In such a manner, the workpiece center O1 coincides with the reference center Ox, and the correction of the workpiece W in the planar direction (X-Y direction) is completed.

Next, the rod portions 33 of the pair of elevation cylinders 31 are lowered. Here, the second mounting surfaces 33a of the elevation cylinders 31 move down from the second position higher than the first mounting surface 11a of the first support portion 11 to the first position lower than the first mounting surface 11a. Thus, the workpiece W is placed on the first mounting surface 11a and is supported by the first support portion 11. Furthermore, the second rotation drive mechanism 2 is also driven, and the second support portion 21 is returned to the original position thereof, which is the same as that illustrated in FIG. 5.

Figure 9:
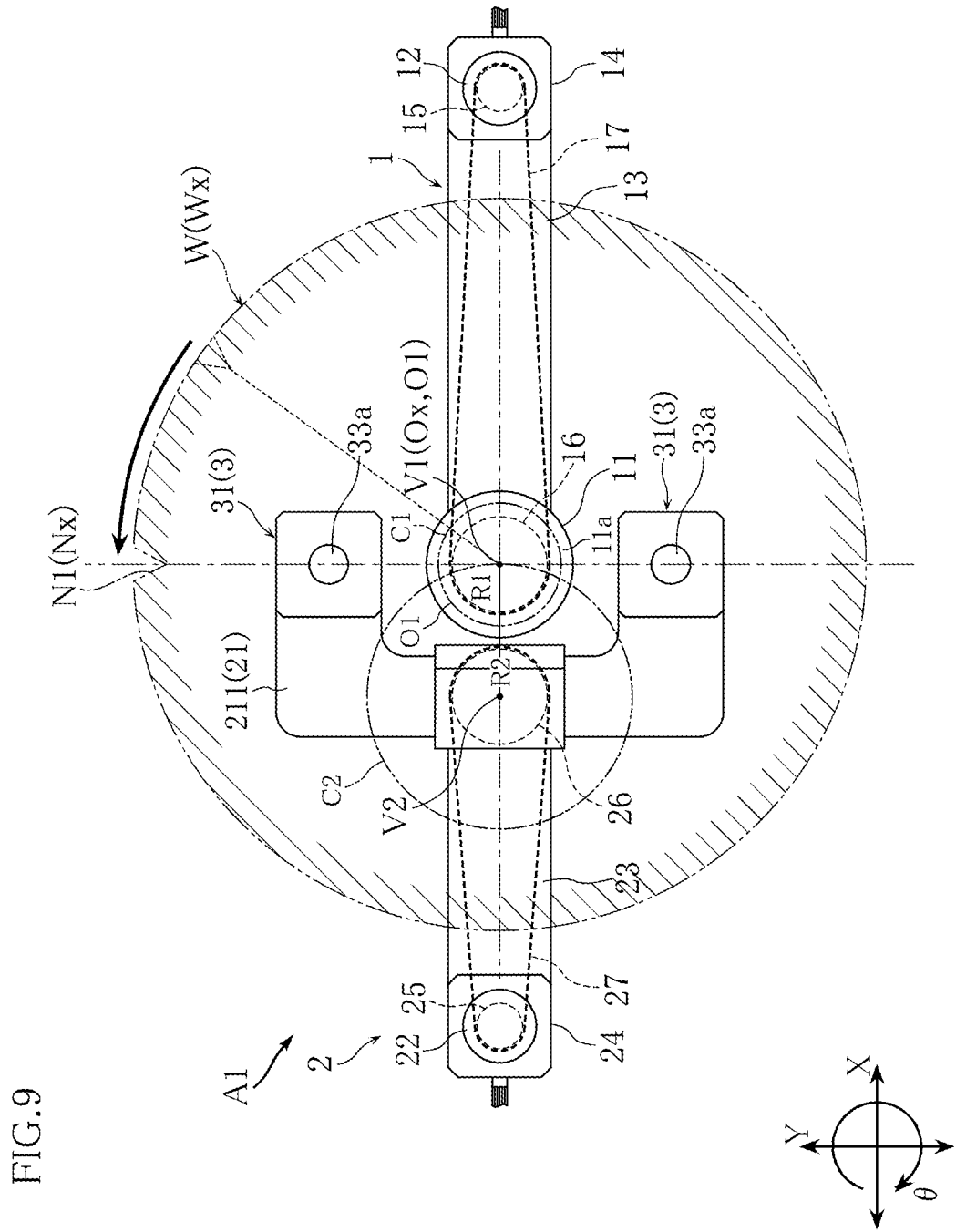
FIG. 9 is a plan view for describing the operating state of the aligner illustrated in FIG. 1.

Next, as illustrated in FIG. 9, the first rotation drive mechanism 1 is driven and the first support portion 11 is rotated in the counterclockwise direction in the drawing as indicated by the bold arrow. Here, the workpiece W placed on the first mounting surface 11a of the first support portion 11 rotates about the first vertical axis V1 (workpiece center O1) while being sucked and held by the suction portion 111, and the notch N1 is moved so as to coincide with the reference notch position Nx in the reference workpiece position Wx. The suction by the suction portion 111 is switched off after the notch N1 has moved so as to coincide with the reference notch position Nx.

Detection using the displacement amount detecting means 9 may be performed, as necessary, before the correction of the position of the notch N1 illustrated in FIG. 9. In this case, the position of the notch N1 when the workpiece center O1 coincides with the reference center Ox can be ascertained more accurately.

Through the above-described sequence of operations of the aligner A1, the displacement of the workpiece W in the planar direction (X-Y direction) and the rotation direction (θ direction) is corrected, and the workpiece W is moved to the reference workpiece position Wx. Subsequently, the hand 8 (not illustrated) is moved into the space above the aligner A1 to lift the workpiece W, and the workpiece W is transferred to a processing chamber or the like.

In the aligner A1 according to the present embodiment, the displacement of a workpiece W in both a planar direction (X-Y direction) and a rotation direction (θ direction) can be corrected through cooperation between a first rotation drive mechanism 1 rotatively driving a first support portion 11 about a first vertical axis V1 and a second rotation drive mechanism 2 rotatively driving a second support portion 21 about a second vertical axis V2. That is, according to the aligner A1, the displacement of the workpiece W in the planar direction (X-Y direction) and the rotation direction (θ direction) about a vertical axis can be corrected in an appropriate manner using two drive shafts (rotation shafts), which is less than the conventional number of drive shafts.

In the aligner A1 according to the present embodiment, a rotation shaft involving a rotational movement is used as a drive shaft for correcting the displacement of the workpiece W in both the first rotation drive mechanism 1 and the second rotation drive mechanism 2. In a case in which translation shafts involving linear movement are used unlike the present embodiment, the number of parts increases and the installation space also increases compared to a case in which rotation shafts are used. In contrast, according to the aligner A1 according to the present embodiment, the first rotation drive mechanism 1 and the second rotation drive mechanism 2 are formed from a small number of parts, and thus cost can be reduced and the structure of the entire device can be simplified while reducing the size of the entire device.

The first support portion 11 rotated about the first vertical axis V1 includes a first mounting surface 11a on which the workpiece W is placed. The second support portion 21 rotated about the second vertical axis V2 is provided with a pair of elevation cylinders 31 (elevation mechanism 3). The pair of elevation cylinders 31 are provided with second mounting surfaces 33a on which the workpiece W is placed, and the second mounting surfaces 33a can move up and down between a first position lower than the first mounting surface 11a of the first support portion 11 and a second position higher than the first mounting surface 11a. According to such a configuration, switching between a state in which the workpiece W is supported by the first support portion 11 and a state in which the workpiece W is supported by the second support portion 21 can be easily performed.

The first support portion 11 of the first rotation drive mechanism 1 is provided with a suction portion 111 for sucking the workpiece W. According to such a configuration, the workpiece W can be prevented from moving during the rotation of the first support portion 11 supporting the workpiece W.

The elevation mechanism 3 includes a plurality of elevation cylinders 31, and the elevation cylinders 31 each have a second mounting surface 33a on the upper end portion thereof. According to such a configuration, the workpiece W is supported by a plurality of second mounting surfaces 33a of a plurality of elevation cylinders 31. Accordingly, with a relatively simple structure, the workpiece W can be moved up and down while stably supporting the workpiece W.

The first rotation drive mechanism 1 is formed from a belt drive mechanism including a first drive source 12, a first arm 13, a first driving pulley 15, a first driven pulley 16, and a first belt 17. Similarly, the second rotation drive mechanism 2 is formed from a belt drive mechanism including a second drive source 22, a second arm 23, a second driving pulley 25, a second driven pulley 26, and a second belt 27. Furthermore, a pair of elevation cylinders 31 are supported by a workpiece-supporting arm 211 (second support portion 21) so as to be separated from one another in the horizontal direction. According to such a configuration, the first drive source 12, the second drive source 22, and the plurality of elevation cylinders 31 (elevation mechanism 3) can be arranged at appropriate positions.

The elevation mechanism 3 supported by the second support portion 21 is formed from a pair of elevation cylinders 31, and the pair of elevation cylinders 31 are arranged at opposite sides of the first vertical axis V1 from one another. According to such a configuration, the workpiece W supported by the second support portion 21 is supported by the pair of elevation cylinders 31 in good balance.

In the first rotation drive mechanism 1, the first drive source 12 is arranged on one side in the X direction, which is parallel with a horizontal plane, from the first driven pulley 16. Furthermore, the second rotation drive mechanism (the second driven pulley 26 and the second drive source 22) are arranged on the other side in the X direction from the first driven pulley 16. On the other hand, the pair of elevation cylinders 31 are arranged so as to be separated from one another in the Y direction, which is parallel with a horizontal plane and is perpendicular to the X direction. According to such a configuration, by moving a hand 8 for transferring the workpiece W along the Y direction, the hand 8 can be moved to a position (position above the aligner A1) where the hand 8 can transfer the workpiece W to the aligner A1 while avoiding interference with the aligner A1.

Figure 10:
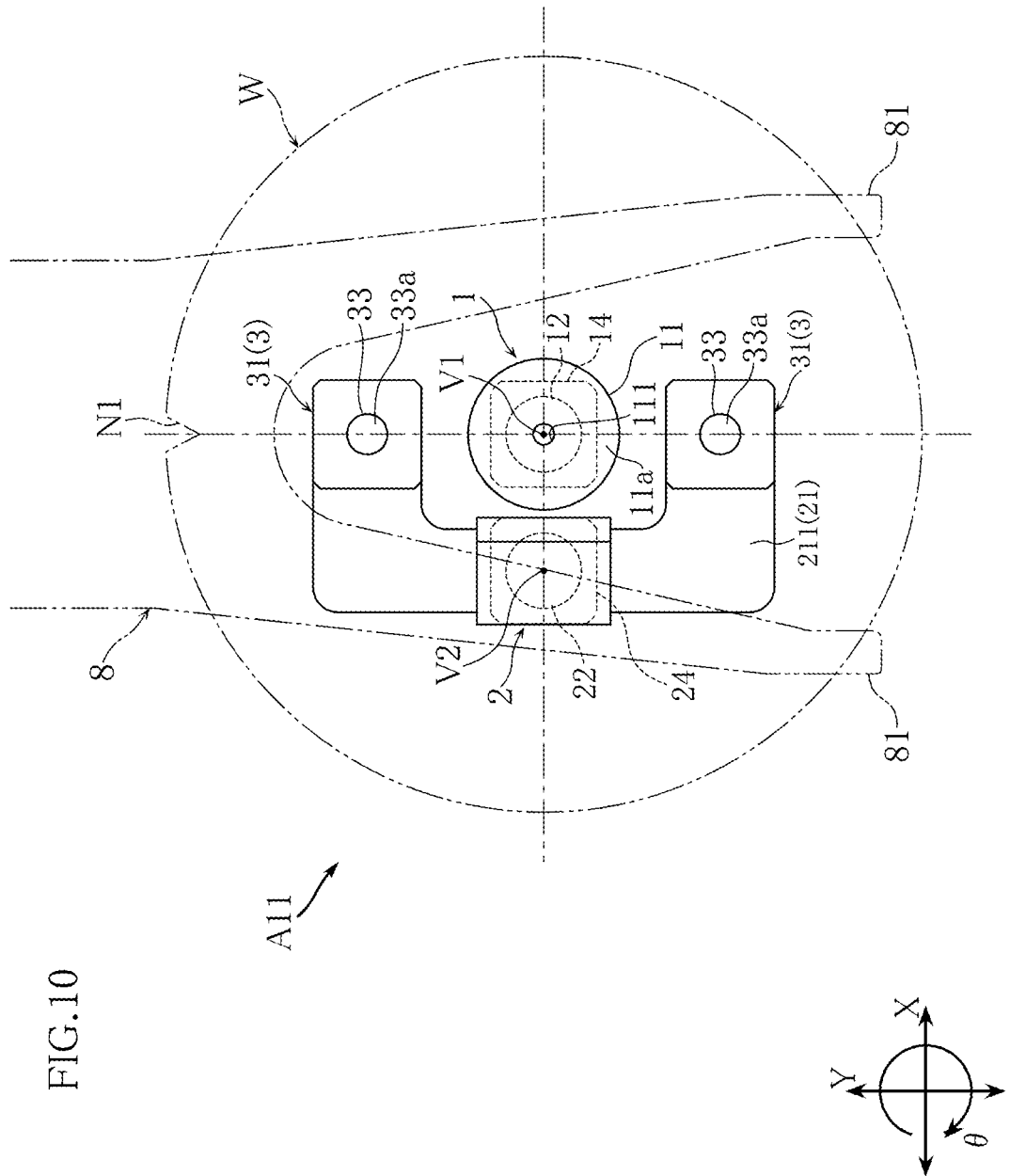
FIG. 10 is a plan view illustrating a modification of the aligner illustrated in FIG. 1.
Figure 11:
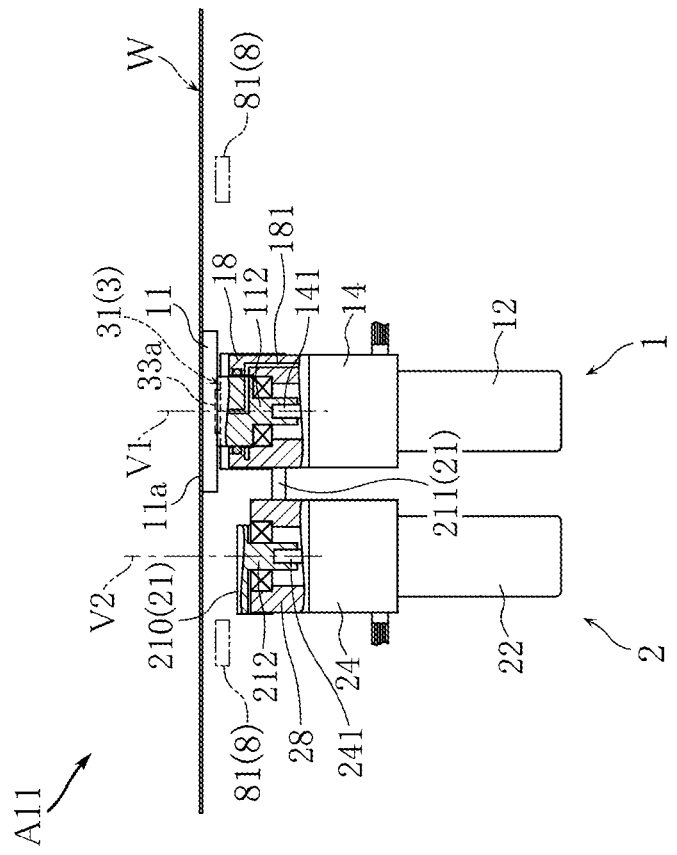
FIG. 11 is a front view of the aligner illustrated in FIG. 10, and a part of the aligner is illustrated in a longitudinal section view.

FIGS. 10 and 11 illustrate a modification of the aligner A1 according to the first embodiment. An aligner A11 according to the present modification differs from the above-described aligner A1 in terms of the configuration of the first rotation drive mechanism 1 and the second rotation drive mechanism 2. In these drawings, elements that are the same as or similar to those in the aligner A1 are provided with the same reference symbols as those in the first embodiment, and description of such elements is omitted as appropriate.

In the aligner A11 illustrated in FIGS. 10 and 11, neither the first rotation drive mechanism 1 nor the second rotation drive mechanism 2 is provided with a belt drive mechanism. Specifically, the first rotation drive mechanism 1 does not include the first arm 13, the first driving pulley 15, the first driven pulley 16, or the first belt 17 in the above-described aligner A1, and includes a connection portion 18 instead. In the present modification, the first drive source 12 is arranged directly below the first support portion 11. The decelerator 14 is arranged above the first drive source 12. The connection portion 18 is provided with a cylindrical shape (or a substantially-cylindrical shape), and is fixed to the upper end portion of the decelerator 14. The rotary shaft 141 of the decelerator 14 is arranged inside the connection portion 18, and the shaft portion 112 of the first support portion 11 is fitted onto this rotary shaft 141 in a state in which the shaft portion 112 cannot rotate relative to the rotary shaft 141. According to the above-described configuration, when the first drive source 12 is driven, the rotary shaft 141 of the decelerator 14 and the shaft portion 112, which cannot rotate relative to the rotary shaft 141, are rotatively driven and the first support portion 11 is rotatively driven about the first vertical axis V1.

The second rotation drive mechanism 2 does not include the second arm 23, the second driving pulley 25, the second driven pulley 26, or the second belt 27 in the above-described aligner A1, and includes a connection portion 28 instead. In the present modification, the second drive source 22 is arranged directly below the second support portion 21 (base portion 210). The decelerator 24 is arranged above the second drive source 22. The connection portion 28 is provided with a cylindrical shape (or a substantially-cylindrical shape), and is fixed to the upper end portion of the decelerator 24. The rotary shaft 241 of the decelerator 24 is arranged inside the connection portion 28, and the shaft portion 212 of the second support portion 21 is fitted onto this rotary shaft 241 in a state in which the shaft portion 212 cannot rotate relative to the rotary shaft 241. According to the above-described configuration, when the second drive source 22 is driven, the rotary shaft 241 of the decelerator 24 and the shaft portion 212, which cannot rotate relative to the rotary shaft 241, are rotatively driven and the second support portion 21 is rotatively driven about the second vertical axis V2.

By operating the aligner A11 according to the present modification in a similar manner as the aligner A1 described with reference to FIGS. 5 to 9, the displacement of a workpiece W in the planar direction (X-Y direction) and the rotation direction (θ direction) is corrected, and the workpiece W can be moved to the reference workpiece position Wx.

In the above-described aligner A11 as well, the displacement of a workpiece W in the planar direction (X-Y direction) and the rotation direction (θ direction) can be corrected through cooperation between a first rotation drive mechanism 1 rotatively driving a first support portion 11 about a first vertical axis V1 and a second rotation drive mechanism 2 rotatively driving a second support portion 21 about a second vertical axis V2. That is, according to the aligner A11, the displacement of the plate-shaped workpiece W in the planar direction (X-Y direction) and the rotation direction (θ direction) about a vertical axis can be corrected in an appropriate manner using two drive shafts (rotation shafts), which is less than the conventional number of drive shafts.

Furthermore, unlike a case in which translation shafts involving a linear movement are used, a small number of parts are used, and thus cost can be reduced and the structure of the entire device can be simplified also in the aligner A11. In addition, the size of the entire device can also be reduced.

Furthermore, the first support portion 11 rotated about the first vertical axis V1 includes a first mounting surface 11a on which the workpiece W is placed. The second support portion 21 rotated about the second vertical axis V2 is provided with a pair of elevation cylinders 31 (elevation mechanism 3). The pair of elevation cylinders 31 are provided with second mounting surfaces 33a on which the workpiece W is placed, and the second mounting surfaces 33a can move up and down between a first position lower than the first mounting surface 11a of the first support portion 11 and a second position higher than the first mounting surface 11a. According to such a configuration, switching between a state in which the workpiece W is supported by the first support portion 11 and a state in which the workpiece W is supported by the second support portion 21 can be easily performed.

Figure 12:
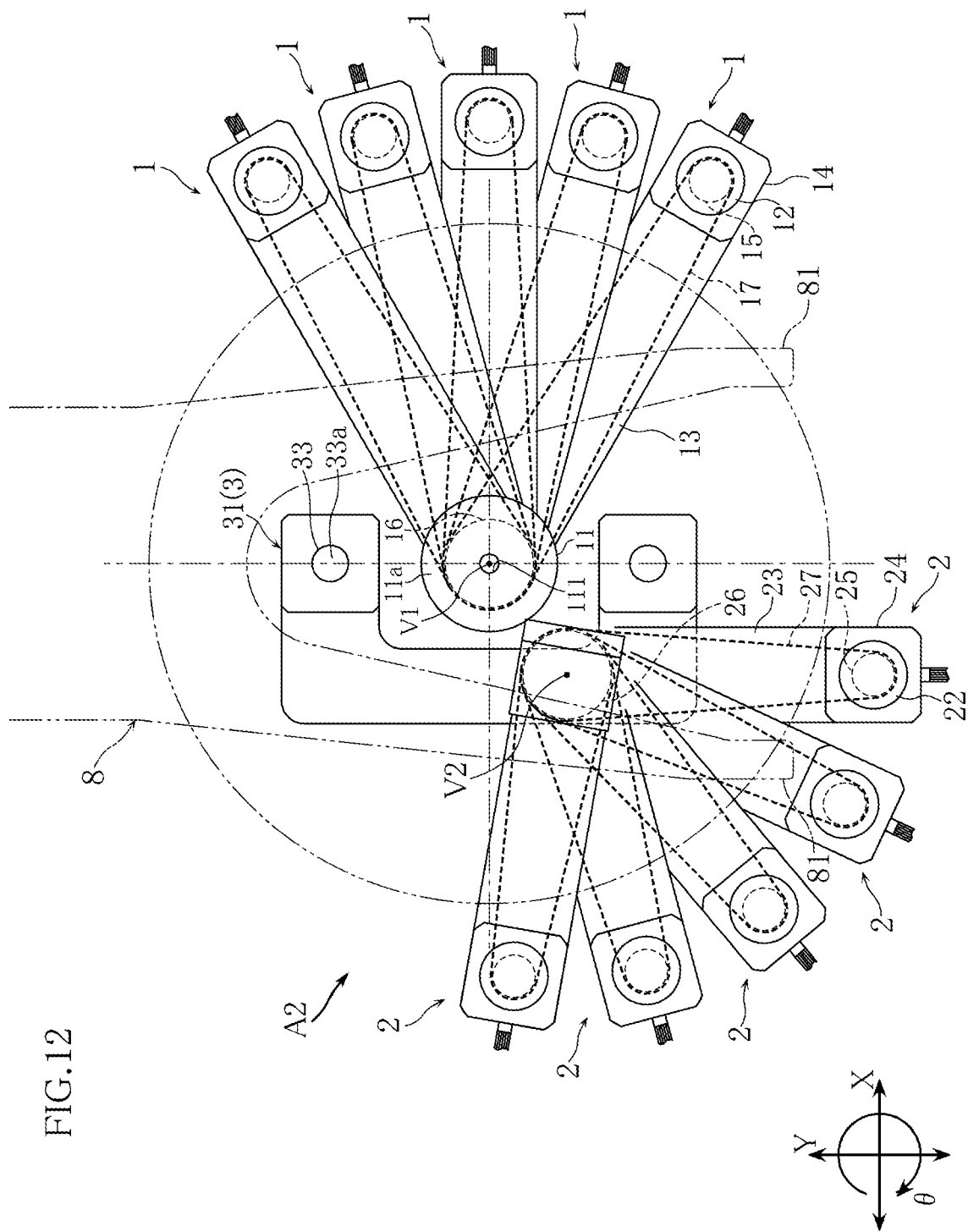
FIG. 12 is a plan view illustrating an aligner according to the first embodiment.
Figure 13:
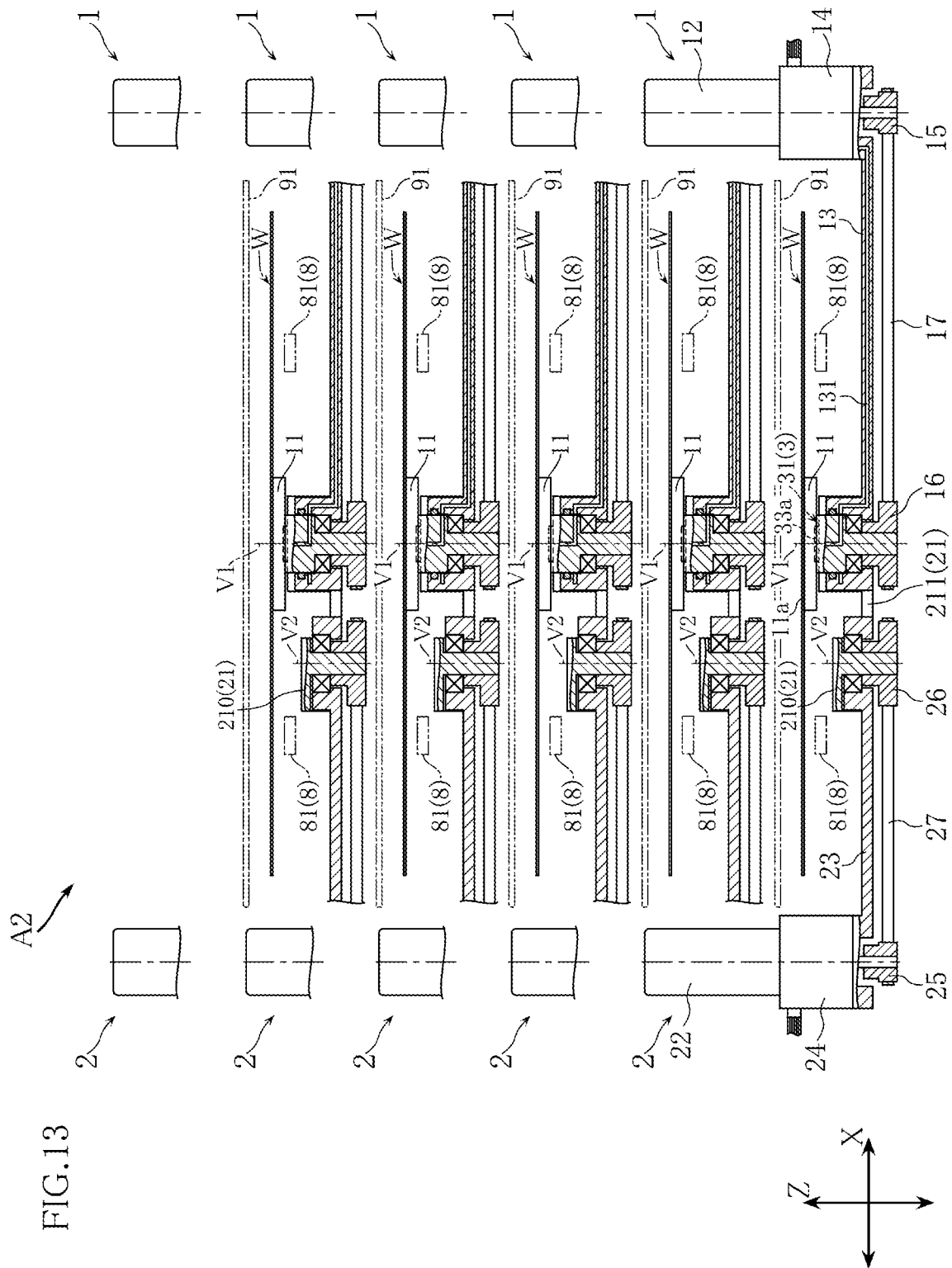
FIG. 13 is a partial front view schematically illustrating the aligner illustrated in FIG. 12, and a part of the aligner is illustrated in a longitudinal section view.

FIGS. 12 and 13 illustrate an aligner according to a second embodiment. In these drawings, elements that are the same as or similar to those in the above-described aligner A1 are provided with the same reference symbols as those in the first embodiment, and description of such elements is omitted as appropriate.

An aligner A2 according to the present embodiment includes a plurality of first rotation drive mechanisms 1, a plurality of second rotation drive mechanisms 2, and a plurality of elevation mechanisms 3. In the illustrated example, the aligner A2 is provided with five each of the first rotation drive mechanism 1, the second rotation drive mechanism 2, and the elevation mechanism 3. The configuration of each first rotation drive mechanism 1, each second rotation drive mechanism 2, and each elevation mechanism 3 in the aligner A2 is substantially the same as that of the first rotation drive mechanism 1, the second rotation drive mechanism 2, and the elevation mechanism 3 (pair of elevation cylinders 31) in the above-described aligner A1.

As illustrated in FIGS. 12 and 13, the first driven pulleys 16 in the plurality of first rotation drive mechanisms 1 are arranged across a gap from one another in the Z direction (top-bottom direction) and are arranged so as to overlap in a plan view. In the present embodiment, the first vertical axes V1 (the rotation axes of the first driven pulleys 16) in the plurality of first rotation drive mechanisms 1 coincide in a plan view. As illustrated in FIG. 12, the first drive source 12 and the first driving pulley 15 in each of the plurality of first rotation drive mechanisms 1 are arranged so as to be separated from the first drive source 12 and the first driving pulley 15 in other ones of the plurality of first rotation drive mechanisms 1 in the circumferential direction of the first vertical axes V1 in a plan view. The first drive sources 12 in the plurality of first rotation drive mechanisms 1 are arranged on one side (the right side in FIG. 12) in the X direction (first direction), which is parallel with a horizontal plane, from the first driven pulleys 16 in the plurality of first rotation drive mechanisms 1.

As illustrated in FIGS. 12 and 13, the second driven pulleys 26 in the plurality of second rotation drive mechanisms 2 are arranged across a gap from one another in the Z direction and are arranged so as to overlap in a plan view. In the present embodiment, the second vertical axes V2 (the rotation axes of the second driven pulleys 26) in the plurality of second rotation drive mechanisms 2 coincide in a plan view. As illustrated in FIG. 12, the second drive source 22 and the second driving pulley 25 in each of the plurality of second rotation drive mechanisms 2 are arranged so as to be separated from the second drive source 22 and the second driving pulley 25 in other ones of the plurality of second rotation drive mechanisms 2 in the circumferential direction of the second vertical axes V2 in a plan view. The second driven pulleys 26 and the second drive sources 22 in the plurality of second rotation drive mechanisms 2 are arranged on the other side (the left side in FIG. 12) in the X direction from the first driven pulleys 16.

As illustrated in FIGS. 12 and 13, the pair of elevation cylinders 31 in each of the plurality of elevation mechanisms 3 are arranged so as to be separated from one another in the Y direction (second direction), which is parallel with a horizontal plane and is perpendicular to the X direction.

In the present embodiment, a hand 8 supporting a workpiece W can move into the space above each set of a first rotation drive mechanism 1 and a second rotation drive mechanism 2. In the present embodiment, a transfer robot having a multi-stage robot hand that can collectively transfer a plurality of workpieces W is used, for example, as the transfer robot used to transfer workpieces W. Furthermore, at a position above the hand 8, a corresponding sensor 91, for example, is arranged for each set of a first rotation drive mechanism 1 and a second rotation drive mechanism 2. As each sensor 91, a sensor that has the function of capturing the outer shape of a planar target object positioned below the sensor as an image by being brought in contact with the target object or by not being brought in contact with but being brought close to the target object is adopted. For example, examples of such a sensor 91 includes a sensor, such as that adopted in touch panels, in which the technique of electrostatically recognizing the presence of a target object is used, a sensor in which a plurality of image sensors such as CCDs are planarly arrayed, or the like.

In the present embodiment, a hand 8 is raised in a state in which the hand 8 has moved into the space above a first rotation drive mechanism 1 and a second rotation drive mechanism 2, for example. Then, displacement amount information of a workpiece W can be acquired using a sensor 91 in a state in which the workpiece W is brought in contact with the sensor 91 or in a state in which the workpiece W is not brought in contact with but brought close to the sensor 91. The sensors 91 can be any sensor as long as the outer shapes of workpieces W can be recognized. Thus, it suffices for a sensor 91 to have a planar shape that is sufficient to recognize the outer shape of a workpiece W within the range in which the workpiece W may be displaced in the X-Y direction. For example, each sensor 91 may have a circular planar shape, an elliptical plane shape, or the like, or may have a rectangular planar shape. Alternatively, each sensor 91 may have a planar shape of a two-dimensional shape with an opening in the middle, such as a circular shape with an opening in the middle.

In the aligner A2 according to the present embodiment, by operating each set of a first rotation drive mechanism 1, a second rotation drive mechanism 2, and an elevation mechanism 3 (pair of elevation cylinders 31) in a similar manner as the aligner A1 (the first rotation drive mechanism 1, the second rotation drive mechanism 2, and the elevation mechanism 3) described with reference to FIGS. 5 to 9, the displacement of a plurality of workpieces W in the planar direction (X-Y direction) and the rotation direction (θ direction) is corrected, and the workpieces W can be moved to the reference workpiece position Wx.

In the present embodiment as well, the displacement of a workpiece W in the planar direction (X-Y direction) and the rotation direction (θ direction) can be corrected through cooperation between a first rotation drive mechanism 1 rotatively driving a first support portion 11 about a first vertical axis V1 and a second rotation drive mechanism 2 rotatively driving a second support portion 21 about a second vertical axis V2. That is, according to the aligner A2, the displacement of the workpiece W in the planar direction (X-Y direction) and the rotation direction (θ direction) about a vertical axis can be corrected in an appropriate manner using two drive shafts (rotation shafts), which is less than the conventional number of drive shafts.

Furthermore, unlike a case in which translation shafts involving a linear movement are used, the number of parts used is reduced, and thus cost can be reduced and the structure of the entire device can be simplified while reducing the size of the entire device in the present embodiment as well.

The aligner A2 also achieves other actions and effects similar to those achieved by the above-described aligner A1. Furthermore, in the aligner A2, the displacement of a plurality of workpieces W can be collectively corrected prior to the transfer of the workpieces W to a processing chamber.

While embodiments and a modification of the present invention have been described above, the present invention is not limited to the embodiments and the modification described above, and all changes that are within the scope of the matters recited in the claims are included in the scope of the present invention.

The invention claimed is:

1. An aligner comprising:
a first rotation drive mechanism that includes a first support portion that supports a workpiece, and a first drive source for rotatively driving the first support portion about a first vertical axis;
a second rotation drive mechanism that includes a second support portion that supports the workpiece, and a second drive source for rotatively driving the second support portion about a second vertical axis; and
an elevation mechanism that moves the workpiece supported by the second support portion up and down.

2. The aligner according to claim 1, wherein
the first support portion includes a first mounting surface on which the workpiece is placed, and
the elevation mechanism includes a second mounting surface on which the workpiece is placed, and moves the second mounting surface up and down between a first position that is lower than the first mounting surface and a second position that is higher than the first mounting surface.

3. The aligner according to claim 2, wherein
the elevation mechanism includes a plurality of elevation cylinders that are arranged so as to be separated from one another in a horizontal direction, and
the elevation cylinders each have the second mounting surface on an upper end portion thereof.

4. The aligner according to claim 3, wherein
the first rotation drive mechanism further includes: a first arm that is connected to the first drive source and that extends in parallel with a horizontal plane; a first driving pulley that is rotatively driven by the first drive source; a first driven pulley that is supported by the first arm so as to be rotatable about the first vertical axis; and a first belt that is wrapped around the first driving pulley and the first driven pulley,
the first support portion is arranged higher than the first driven pulley and is connected to the first driven pulley,
the second rotation drive mechanism further includes: a second arm that is connected to the second drive source and that extends in parallel with a horizontal plane; a second driving pulley that is rotatively driven by the second drive source; a second driven pulley that is supported by the second arm so as to be rotatable about the second vertical axis; and a second belt that is wrapped around the second driving pulley and the second driven pulley,
the second support portion includes a workpiece-supporting arm that extends in parallel with a horizontal plane, and
the plurality of elevation cylinders are supported by the workpiece-supporting arm so as to be separated from one another.

5. The aligner according to claim 4, wherein
the first drive source is arranged on one side in a first direction parallel with a horizontal plane with respect to the first driven pulley,
the second driven pulley and the second drive source are arranged on the other side in the first direction with respect to the first driven pulley,
the elevation mechanism comprises a pair of the elevation cylinders, and
the pair of elevation cylinders are arranged on opposite sides of the first vertical axis from one another.

6. The aligner according to claim 5 further comprising:
a plurality of first rotation drive mechanisms, a plurality of second rotation drive mechanisms, and a plurality of elevation mechanisms, wherein
the first driven pulleys in the plurality of first rotation drive mechanisms are arranged across a gap from one another in a top-bottom direction and are arranged so as to overlap in a plan view,
the first drive source and the first driving pulley in each of the plurality of first rotation drive mechanisms are arranged across a gap from the first drive source and the first driving pulley in other ones of the plurality of first rotation drive mechanisms in a circumferential direction of the first vertical axis in a plan view,
the second driven pulleys in the plurality of second rotation drive mechanisms are arranged across a gap from one another in the top-bottom direction and are arranged so as to overlap in a plan view, and the second drive source and the second driving pulley in each of the plurality of second rotation drive mechanisms are arranged across a gap from the second drive source and the second driving pulley in other ones of the plurality of second rotation drive mechanisms in the circumferential direction of the second vertical axis in a plan view.

* * * * *